United States Patent
Chang et al.

(10) Patent No.: US 7,587,293 B2
(45) Date of Patent: Sep. 8, 2009

(54) SEMICONDUCTOR CP (CIRCUIT PROBE) TEST MANAGEMENT SYSTEM AND METHOD

(75) Inventors: Chih-Chien Chang, Yilan County (TW); Keng-Chia Yang, Hsin-Chu (TW); Yi-Sheng Huang, Taipei County (TW); Ben Shin, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 147 days.

(21) Appl. No.: 11/746,222

(22) Filed: May 9, 2007

(65) Prior Publication Data
US 2008/0281536 A1 Nov. 13, 2008

(51) Int. Cl.
G06F 19/00 (2006.01)
(52) U.S. Cl. ..................................... 702/108
(58) Field of Classification Search .................. 702/58, 702/81, 84, 108, 117; 324/758, 765; 714/25, 714/46
See application file for complete search history.

(56) References Cited

U.S. PATENT DOCUMENTS

| 6,049,895 A * | 4/2000 | Sugimoto | 714/46 |
| 6,236,952 B1 * | 5/2001 | Jun et al. | 702/119 |
| 2004/0122605 A1 * | 6/2004 | Miyazaki | 702/57 |

* cited by examiner

*Primary Examiner*—Bryan Bui
(74) *Attorney, Agent, or Firm*—Thomas, Kayden, Horstemeyer & Risley (57) ABSTRACT

A system and method for semiconductor CP (circuit probe) test management. A control request message is received from a client computer, directing alignment of a probe unit or a wafer in a prober, attachment of a probe pin of the probe unit on a specific area of the wafer, and subsequent execution of CP testing. At least one control command corresponding to the control request message is issued to direct the prober for alignment of the probe unit or the wafer, attachment of the probe pin of the probe unit on the specific area of the wafer, and subsequent execution of CP testing.

18 Claims, 9 Drawing Sheets

SEMICONDUCTOR CP (CIRCUIT PROBE) TEST MANAGEMENT SYSTEM AND METHOD

BACKGROUND

The invention relates to semiconductor product test technology, and more particularly, to methods and systems of CP (Circuit Probe) test.

A conventional semiconductor factory typically includes fabrication tools processing semiconductor wafers for a particular purpose, such as photolithography, chemical-mechanical polishing, or chemical vapor deposition. During manufacture, the semiconductor wafer passes through a series of process steps performed by various fabrication tools. For example, in the production of an integrated semiconductor product, the semiconductor wafer passes through up to 600 process steps. The cost of such automated production is greatly influenced by how efficiently the manufacturing process can be monitored or controlled, such that the ratio of defect-free products to the overall number of products manufactured (i.e., yield ratio) achieves the greatest possible value. The individual process steps, however, are subject to fluctuation and irregularities, which in the worst case may generate a defective number of chips or the entire wafer. Therefore, each individual process step must be carried out as stably as possible to ensure an acceptable yield after the completed processing of a wafer.

Circuit probe (CP) testing systems/methods have been used in a variety of semiconductor fabrication processes to acquire yield data. A test program is provided by a user or operator for a CP test on a particular semiconductor product. The test program describes a test flow including multiple test items, typically optimally arranged to reduce CP testing time. A CP test station then follows the predefined test flow to sequentially probe all dies on a wafer to determine whether a die is good or bad. After completing the entire CP test, results of test attributes such as yield values, quantities of good dies, reparable dies, power short dies and the like, for wafers, wafer lots or semiconductor products, are acquired. Test results are subsequently carried into SBC/SBL rules to generate final advisories such as acceptance, scrap, hold for analysis, downgrade and the like, for wafers, wafer lots or semiconductor products.

Customers are conventionally unable to acquire CP test data and operate CP tools directly, and thus, must communicate with operators by telephone to acquire online CP test data and indirectly operate CP tools. Such labor-intensive methods severely hinder efficiency and reduce customer satisfaction.

SUMMARY

Methods for semiconductor CP (circuit probe) management performed by a server computer are provided. An embodiment of a method for semiconductor CP management comprises the following steps. A control request message is received from a client computer. The control request message directs alignment of a probe unit or a wafer in a prober, attachment of a probe pin of the probe unit on a specific area of the wafer, and subsequent execution of CP testing. At least one control command corresponding to the control request message is issued to direct the prober for alignment of the probe unit or the wafer, attachment of the probe pin of the probe unit on the specific area of the wafer, and subsequent execution of CP testing.

In an aspect, the method further determines whether remote control function is enabled, and if so, issues the control command corresponding to the control request message to the prober. Remote control function is disabled when the prober is controlled by a remote user through Internet, or by an operator locally through control panel on the prober.

In an aspect, the method further disables remote control function after receiving acknowledgement of the control command from the prober and enables remote control function after receiving a probe completion message indicating corresponding CP testing is complete, wherein the acknowledgement indicates the control command is permitted.

In an aspect, the method further receives a probe completion message indicating corresponding CP testing is complete, and returns the probe completion message to the client computer.

Systems for semiconductor CP test management are also provided. An embodiment of a system for semiconductor CP test management comprises a prober and a server computer. The server computer, coupled to the porber, receives a control request message from a client computer, directing alignment of a probe unit or a wafer in the prober, attachment of a probe pin of the probe unit on a specific area of the wafer, and subsequent execution of CP testing, and issues at least one control command corresponding to the control request message to direct the prober for alignment of the probe unit or the wafer, attachment of the probe pin of the probe unit on the specific area of the wafer, and subsequent execution of CP testing.

In an aspect, the server computer further determines whether remote control function is enabled, and if so, issues the control command corresponding to the control request message to the prober. Remote control function is disabled when the prober is controlled by a remote user through Internet, or by an operator locally through control panel on the prober.

In an aspect, the server computer further disables remote control function after receiving acknowledgement of the control command from the prober and enables remote control function after receiving a probe completion message indicating corresponding CP testing is complete, wherein the acknowledgement indicates the control command is permitted.

In an aspect, the server computer further receives a probe completion message indicating corresponding CP testing is complete, and returns the probe completion message to the client computer.

In an aspect, the server computer further couples to the prober via RS232 or GBIP link. The control request message is received through a firewall preventing unauthorized Internet users to access the server computer.

Preferably, the specific area on the wafer is a metal pad. The prober raises the probe pin off the specific area on the wafer after CP testing is complete. The control request message is received via Internet.

BRIEF DESCRIPTION OF THE DRAWINGS

The invention will become apparent by referring to the following detailed description of embodiments with reference to the accompanying drawings, wherein.

DESCRIPTION

Figure 1:
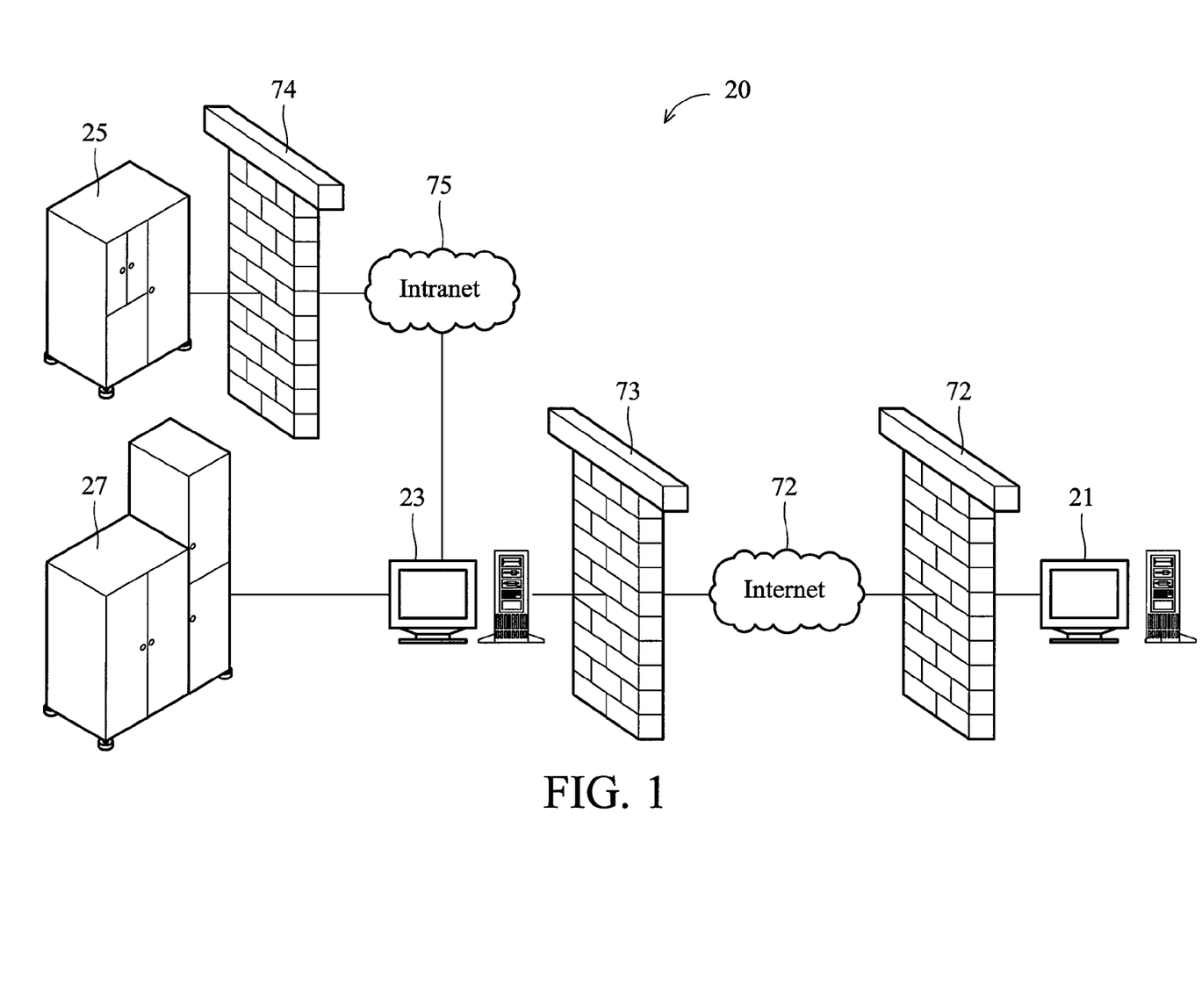
FIG. 1 is a diagram of network architecture of an embodiment of a semiconductor CP (Circuit Probe) test management system.

FIG. 1 is a diagram of network architecture of an embodiment of a semiconductor CP (Circuit Probe) test management system. The semiconductor CP test management system 20 comprises a client computer 21, a server computer 23, a tester 25 and a prober 27. Server computer 23 operates in a networked environment using logical connections to one or more remote computers, such as client computer 21. When used in a WAN-networking environment, the client computer 21 and server computer 23 typically include ADSL modems or any other type of communication device for establishing communications over the wide area network, such as the Internet 71. Those skilled in the art will recognize that client computer 21 and server computer 23 may be connected in different types of networking environments, and communicate between different types of networking environments through various types of transmission devices such as routers, gateways, access points, base station systems or others. The client computer 21 communicates with the server computer 23 through firewalls 72 and 73. The firewall 73 is designed to prevent unauthorized access to or from a private network, and can be implemented in hardware, software, or a combination of both. It is frequently used to prevent unauthorized Internet users from accessing private networks connected to Internet 71, particularly intranets 75. All messages entering or leaving the intranet 75 pass via the firewall 73, which examines each message and blocks those not meeting specified security criteria. The server computer 23 operates in a networked environment using logical connections to one or more remote testers, such as the tester 25. When used in a LAN-networking environment, the server computers 23 and the tester 25 are connected to the Intranet 75 through network interfaces or adapters. When used in a WLAN-networking environment, the server computers 23 and the tester 25 are connected to the Intranet 75 through wireless network interfaces or adapters. In order to provide rigid security, the server computers 23 and the prober 27 are peer-to-peer connected preferably via RS232 or GBIP link.

Figure 2A:
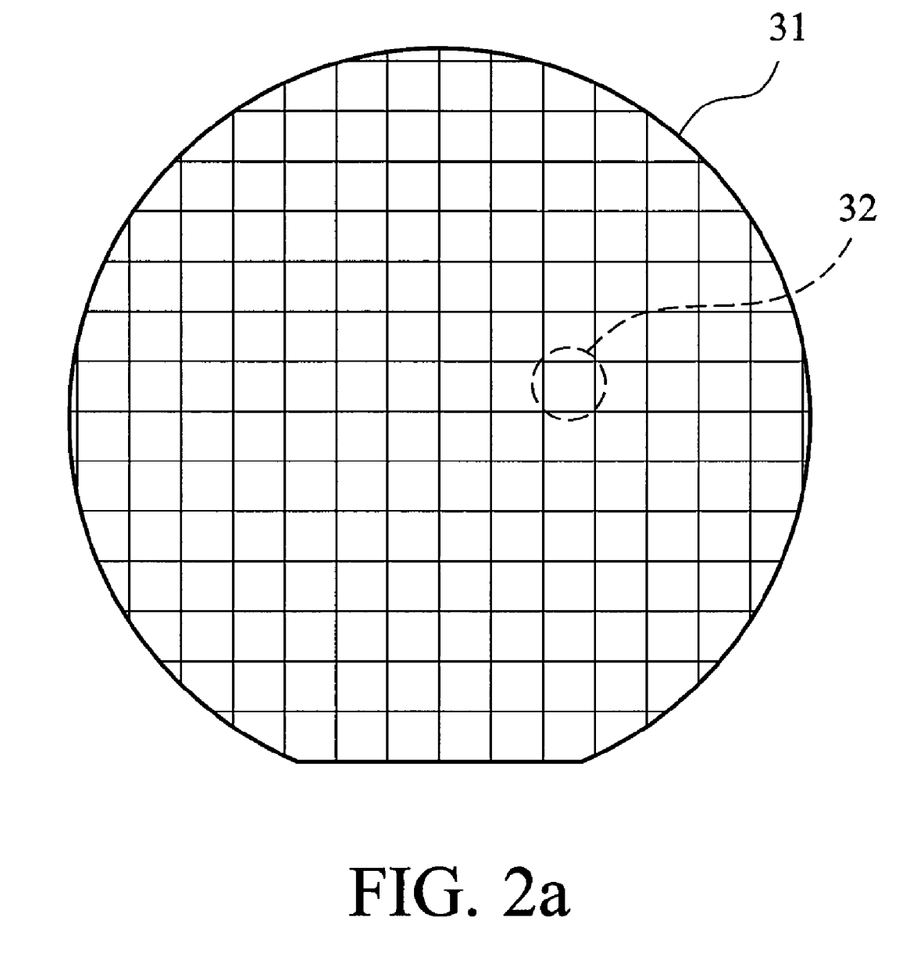
FIGS. 2*a* to 2*c* are diagrams of an exemplary wafer.
Figure 2B:
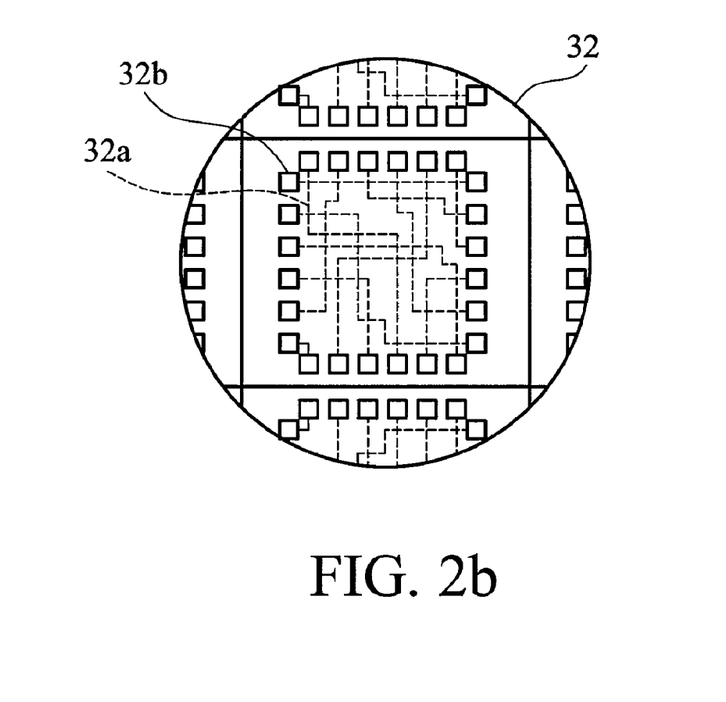
Figure 2C:
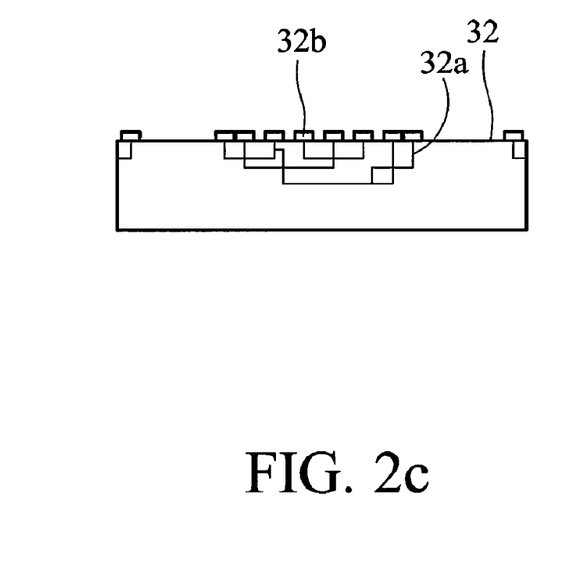

FIGS. 2a to 2c are diagrams of an exemplary wafer 31. ICs (integrated circuits) 32a are built from round, thin sheets of semiconducting material. Standard sheets, or wafers, are commonly made of silicon. The integrated circuits 32a are embedded in the silicon, just below its surface. Within this microscopic maze of circuitry, electrical signals flow from one point to the next. To interact with the tester 25 outside of the IC, these signals are passed back and forth through small metal pads 32b attached to the wafer surface.

Figure 3A:
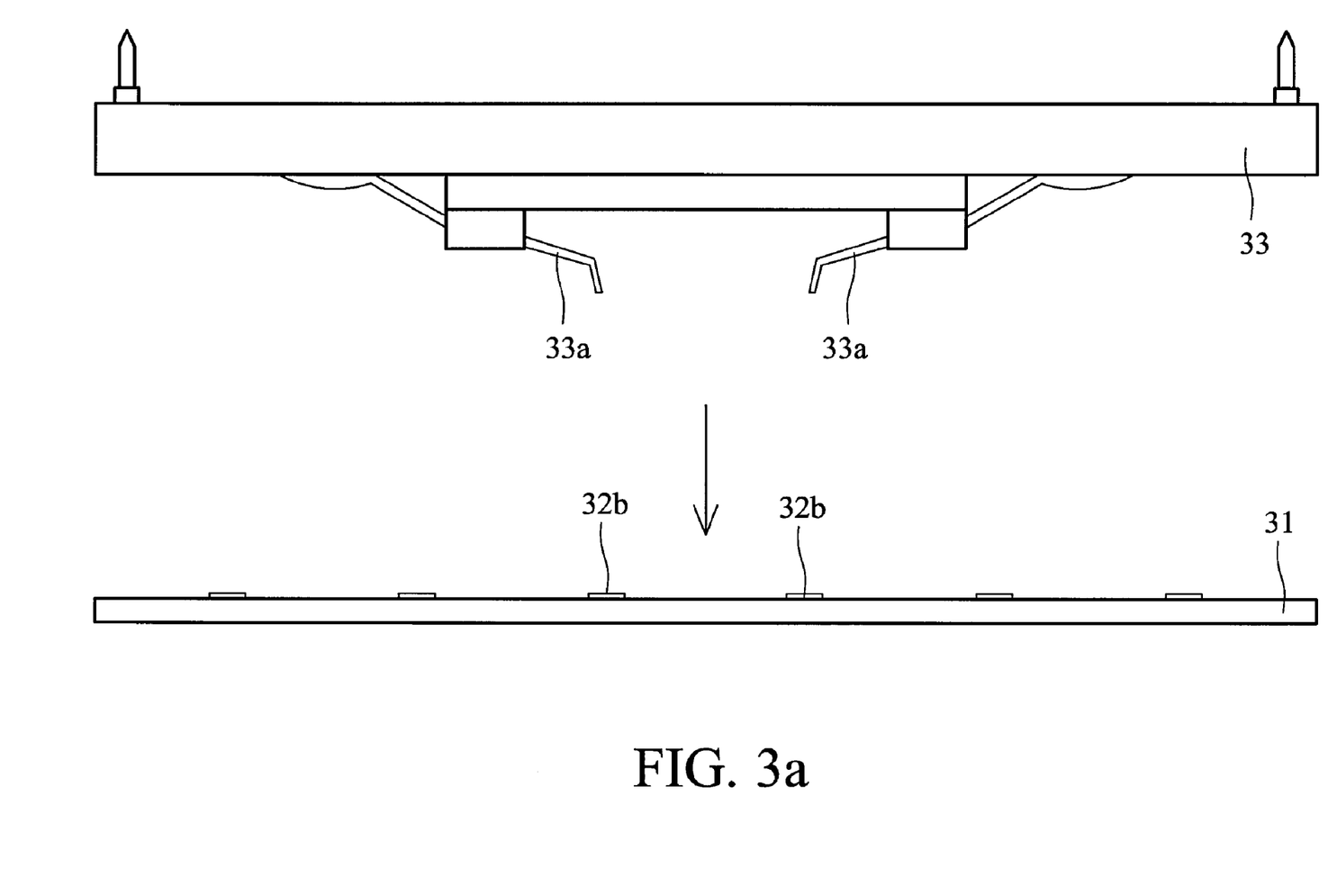
FIGS. 3*a* to 3*c* are schematic diagrams of CP testing performed by an exemplary probe unit.
Figure 3B:
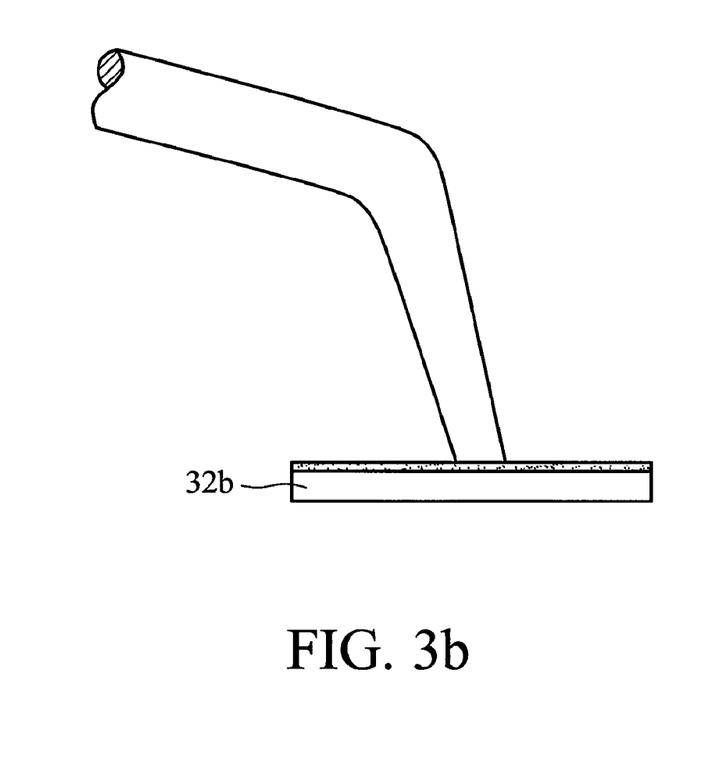
Figure 3C:
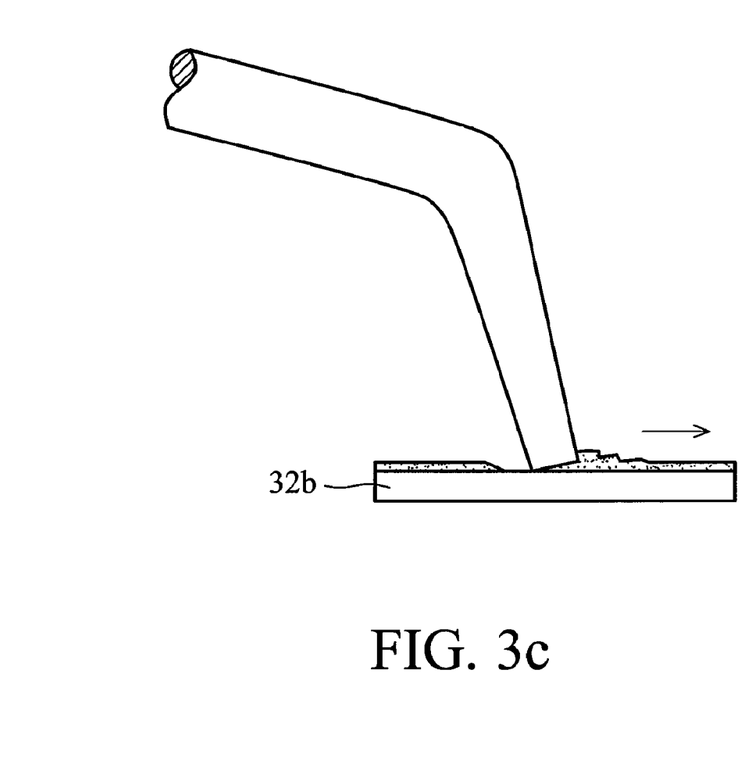

FIGS. 3a to 3c are schematic diagrams of CP testing performed by an exemplary probe unit 33 comprising a probe pin 33a in the prober 27. In the testing of integrated circuits, a probe unit 33 contacts the metal pads 32b on a wafer surface. ICs 32a on a wafer 31 are tested by the tester 25, which sends a series of electrical signals to each IC. During testing, the probe unit 33 and ICs 31a are held in place by the prober 27. The prober 27 is operated as the "arm" of the tester 25, performing the mechanical function of moving and aligning the probe unit 33 or the wafer 31. The probe unit 33 then operates like the "hand" of the tester 25, allowing it to attach the metal pads 32b on a wafer surface. This establishes an electrical connection between the tester 25 and ICs 32a, allowing signals to flow between them. The ICs 32a response to these test signals then indicates whether it has been made correctly. Good ICs are then separated from bad ones. When the probe pin 33a is attached to the metal pad 32b, as shown in FIG. 3b, movement of the probe unit 33 damages the metal pad 32b, as shown in FIG. 3c, as well as the entire wafer 31, and, such movement is to be avoided.

Figure 4:
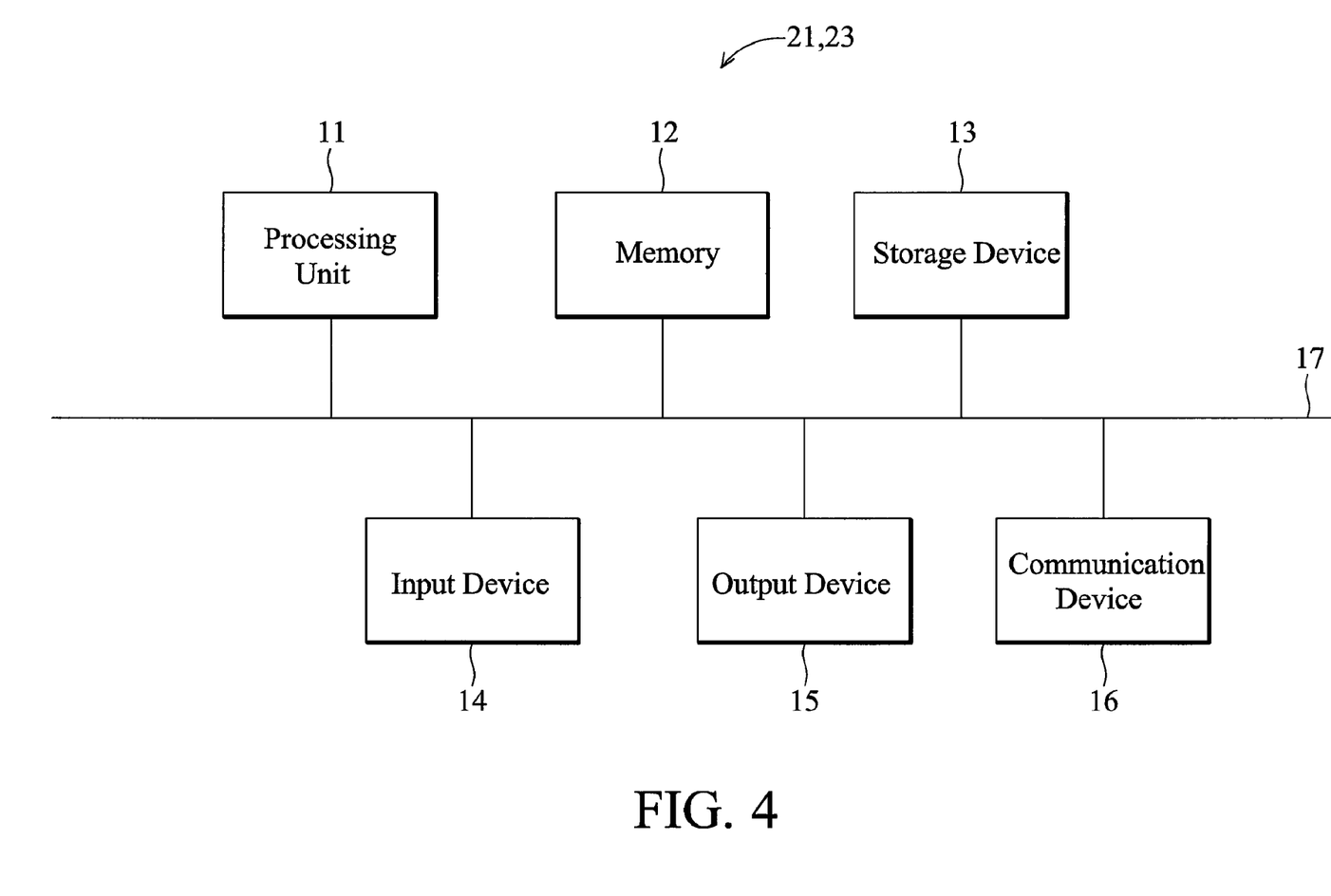
FIG. 4 is a diagram of a hardware environment applicable to computers in an embodiment of a semiconductor CP test management system.

FIG. 4 is a diagram of a hardware environment applicable to computers in an embodiment of a semiconductor CP test management system. The description of FIG. 4 provides a brief, general description of suitable computer hardware and a suitable computing environment for the client computer 21 and server computer 23 in conjunction with which at least some embodiments of the invention may be implemented. The hardware environment of FIG. 4 includes a processing unit 11, a memory 12, a storage device 13, an input device 14, an output device 15 and a communication device 16. The processing unit 11 is connected by buses 17 to the memory 12, storage device 13, input device 14, output device 15 and communication device 16 based on Von Neumann architecture. There may be one or more processing units 11, such that the processor of the computer comprises a single central processing unit (CPU), a micro processing unit (MPU) or multiple processing units, commonly referred to as a parallel processing environment. The memory 12 is preferably a random access memory (RAM), but may also include read-only memory (ROM) or flash ROM. The memory 12 preferably stores program modules executed by the processing unit 11 to perform semiconductor CP test management functions. Generally, program modules include routines, programs, objects, components, or others, that perform particular tasks or implement particular abstract data types. Moreover, those skilled in the art will understand that at least some embodiments may be practiced with other computer system configurations, including handheld devices, multiprocessor-based, microprocessor-based or programmable consumer electronics, network PCs, minicomputers, mainframe computers, and the like. Some embodiments may also be practiced in distributed computing environments where tasks are performed by remote processing devices linked through a communication network. In a distributed computing environment, program modules may be located in both local and remote memory storage devices based on various remote access architecture such as DCOM, CORBA, Web objects, Web Services or other similar architectures. The storage device 13 may be a hard drive, magnetic drive, optical drive, a portable drive, or nonvolatile memory drive. The drives and associated computer-readable media thereof (if required) provide nonvolatile storage of computer-readable instructions, data structures, program modules. The processing unit 11, controlled by program modules received from the memory 12 and from an operator through the input device, directs experiment management functions.

Figure 5:
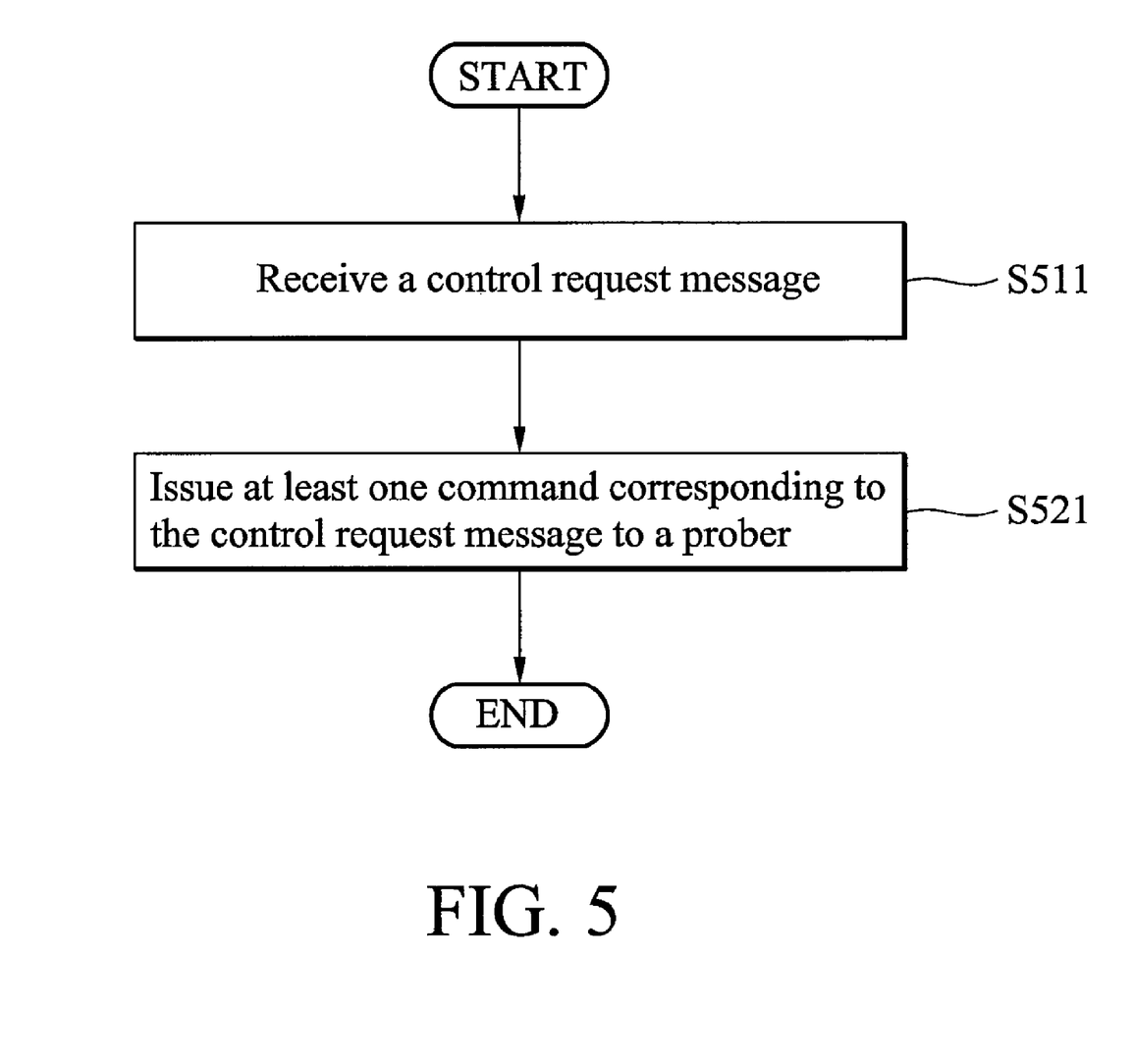
FIG. 5 is a flowchart of an embodiment of a method of semiconductor CP test management performed by a server computer.

FIG. 5 is a flowchart of an embodiment of a method of semiconductor CP test management performed by the server computer 23. In step S511, a control request message is received from the client computer 21. The control request message directs alignment of a probe unit or a wafer in the prober 27, attachment of a probe pin of the probe unit on a specific area on the wafer, and subsequent execution of CP testing. In step S521, at least one control command corresponding to the control request message is issued to direct the prober 27 for alignment of the probe unit or the wafer, attachment of the probe pin of the probe unit on the specific area on the wafer, and subsequent execution of CP testing.

Figure 6:
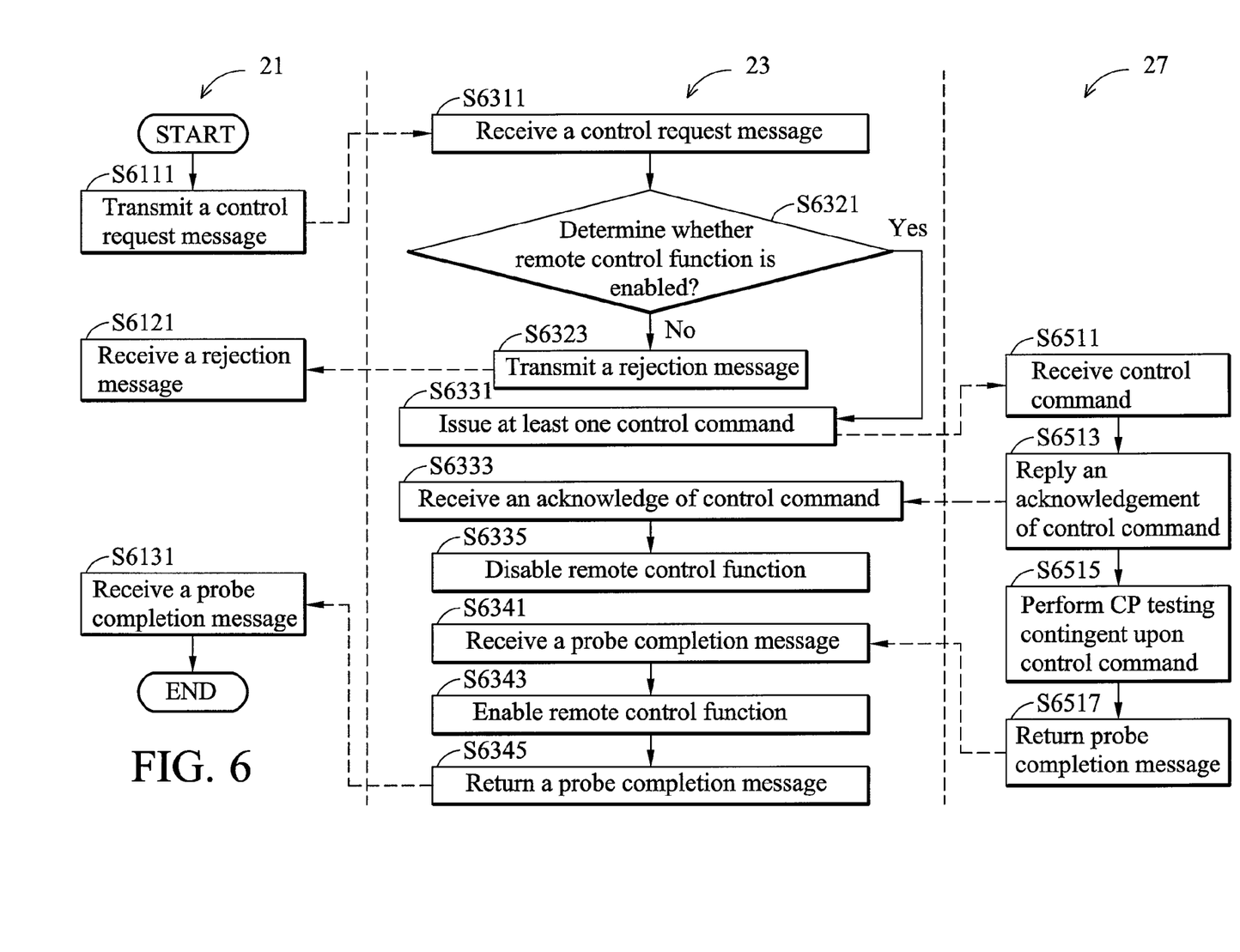
FIG. 6 is a flowchart of an embodiment of a method of semiconductor CP test management.

FIG. 6 is a flowchart of an embodiment of a method of semiconductor CP test management, divided into three sections, a left section showing steps performed by the client computer 21, a middle section showing steps performed by the server computer 23, and a right section showing steps performed by the prober 27, separated by two dashed lines for added clarity.

In step S6111, a control request message is transmitted by the client computer 21, directing alignment of a probe unit or a wafer in the prober 27, attachment of a probe pin of the probe unit on a specific metal pad of the wafer, and subsequent execution of CP testing. In step S6311, the control request message is received by the server computer 23. In order to avoid moving a probe unit when a probe pin thereof is attached on a metal pin, in step S6321, it is determined whether remote control function is enabled, and, if so, the process proceeds to S6331, and otherwise, to S6323. Remote control function disability indicates the prober 27 is controlled by a remote user through Internet 71, or by an operator locally through control panel on the prober 27. In step S6323, a rejection message is transmitted to the client computer 21.

In step S6331, at least one control command is issued by the server computer 23, directing alignment of a probe unit or a wafer in the prober 27, attachment of a probe pin of the probe unit on a specific metal pad of the wafer, and subsequent execution of CP testing. The server computer 23 may follow a series of procedural steps to send commands to the prober 27, and the prober 27 takes actions accordingly. In step S6511, the control command is received by the prober 27. In step S6513, an acknowledgement corresponding to the received control command is returned to the server computer 23. The acknowledgement indicates that the control command is permitted. In step S6333, an acknowledgement is received by the server computer 23. In step S6335, remote control function is disabled by server computer 23. In step S6515, a CP test is performed by the prober 27 contingent upon the received control command. After the CP test is completed, in step S6517, a probe completion message corresponding to the received control command is returned to the server computer 23. Note that a probe unit is raised off a metal pad after the CP test is completed. The probe completion message indicates corresponding CP testing is complete. In step S6341, a probe completion message is received by the server computer 23. In step S6343, remote control function is enabled. In step S6345, a probe completion message corresponding to the received control command is returned to the client computer 21.

Figure 7:
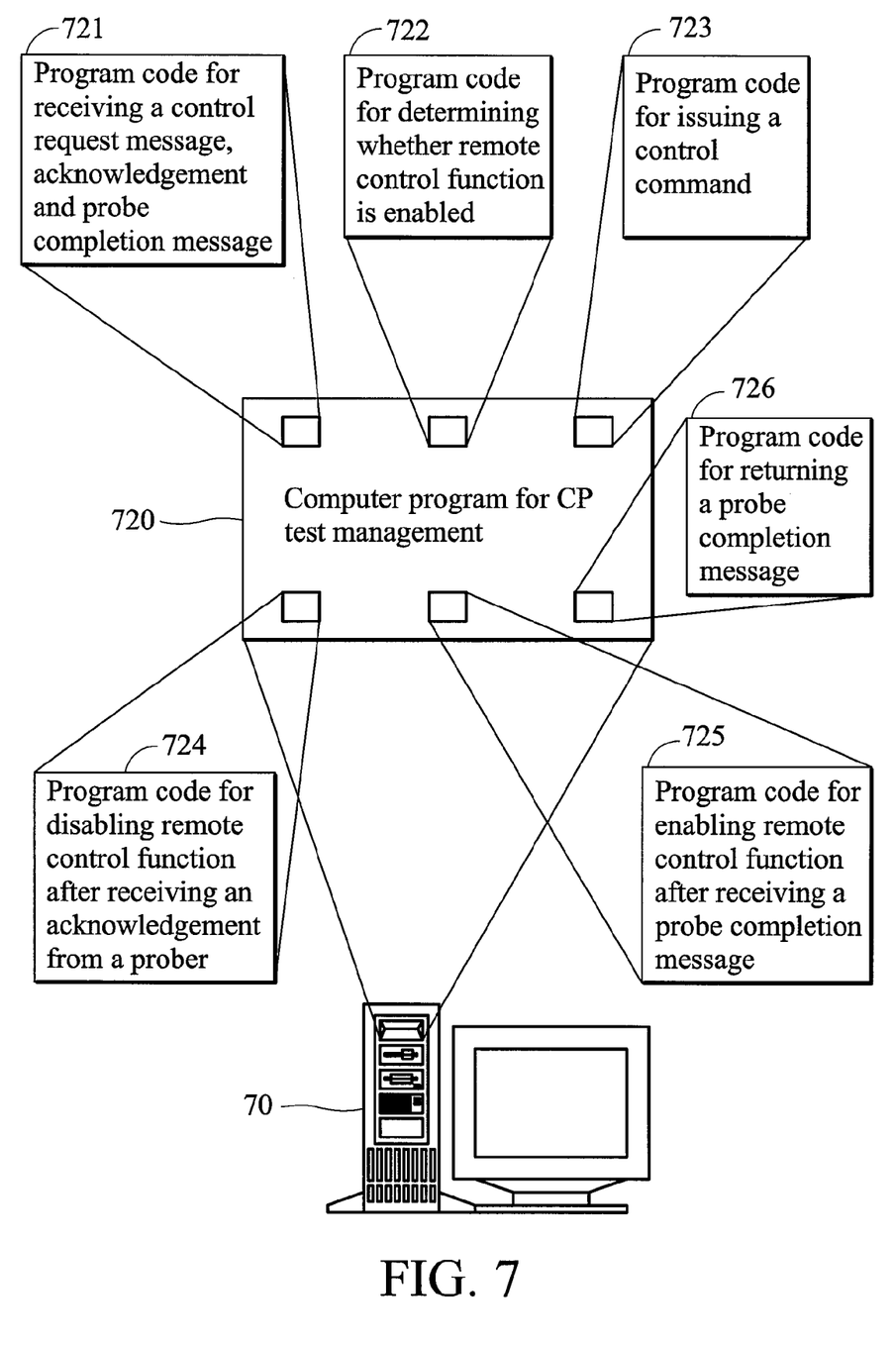
FIG. 7 is a diagram of a storage medium storing a computer program providing an embodiment of a method of semiconductor CP test management.

Also disclosed is a storage medium as shown in FIG. 7 storing a computer program 720 providing the disclosed method of semiconductor CP test management performed by the server computer 23. The computer program product includes a storage medium 70 having computer readable program code embodied therein. The computer readable program code comprises at least computer readable program code 721 receiving a control request message, acknowledgement and probe completion message, computer readable program code 722 determining whether remote control function is enabled, computer readable program code 723 issuing a control command, computer readable program code 724 disabling remote control function after receiving an acknowledgement from a prober, computer readable program code 725 enabling remote control function after receiving a probe completion message and computer readable program code 726 returning a probe completion message.

The methods and systems of the embodiments, or certain aspects or portions thereof, may take the form of program code (i.e., instructions) embodied in tangible media, such as floppy diskettes, CD-ROMS, hard drives, or any other machine-readable storage medium, wherein, when the program code is loaded into and executed by a machine, such as a computer, the machine becomes an apparatus for practicing the invention. The methods and apparatus of the present invention may also be embodied in the form of program code transmitted over some transmission medium, such as electrical wiring or cabling, through fiber optics, or via any other form of transmission, wherein, when the program code is received and loaded into and executed by a machine, such as a computer, the machine becomes an apparatus for practicing the invention. When implemented on a general-purpose processor, the program code combines with the processor to provide a unique apparatus that operates analogously to specific logic circuits.

Although the present invention has been described in terms of preferred embodiment, it is not intended to limit thereto. Those skilled in the technology can still make various alterations and modifications without departing from the scope and spirit of this invention. Therefore, the scope of the present invention shall be defined and protected by the following claims and their equivalents.

What is claimed is:

1. A method of semiconductor CP (circuit probe) test management comprising using a server computer to perform the steps of:
  receiving a control request message from a client computer, directing alignment of a probe unit or a wafer in a prober, attachment of a probe pin of the probe unit on a specific area of the wafer, and subsequent execution of CP testing;
  issuing at least one control command corresponding to the control request message to direct the prober for alignment of the probe unit or the wafer, attachment of the probe pin of the probe unit on the specific area of the wafer, and subsequent execution of CP testing;
  receiving a probe completion message indicating corresponding CP test is complete; and
  returning the probe completion message to the client computer.

2. The method of claim 1 wherein the specific area is a metal pad.

3. The method of claim 1 wherein the issuing step comprises determining whether remote control function is enabled, and if so, issuing the control command corresponding to the control request message to the prober.

4. The method of claim 3 wherein remote control function is disabled when the prober is controlled by a remote user through Internet, or by an operator locally through control panel on the prober.

5. The method of claim 3 further comprising a step of disabling remote control function after receiving an acknowledgement corresponding to the control command from the prober, wherein the acknowledgement indicates the control command is permitted.

6. The method of claim 5 further comprising steps of:
  enabling remote control function after receiving the probe completion message indicating corresponding CP testing is complete; and
  returning the probe completion message to the client computer.

7. The method of claim 6 wherein the prober raises the probe pin off the specific area on the wafer after CP testing is complete.

8. The method of claim 1 wherein the control request message is received via Internet.

9. A system for semiconductor CP (circuit probe) test management comprising:
   a prober; and
   a server computer coupling to the prober, receiving a control request message from a client computer, directing alignment of a probe unit or a wafer in a prober, attachment of a probe pin of the probe unit on a specific area of the wafer, and subsequent execution of CP testing, and issuing at least one control command corresponding to the control request message to direct the prober for alignment of the probe unit or the wafer, attachment of the probe pin of the probe unit on the specific area of the wafer, and subsequent execution of CP testing, wherein
   the server computer receives a probe completion message indicating CP test operation corresponding to the control command is completely performed, and returns the probe completion message to the client computer.

10. The system of claim 9 wherein the specific area is a metal pad.

11. The system of claim 9 wherein the server computer determines whether remote control function is enabled, and if so, issues the control command corresponding to the control request message to the prober.

12. The system of claim 9 wherein remote control function is disabled when the prober is controlled by a remote user through Internet, or by an operator locally through control panel on the prober.

13. The system of claim 11 wherein the server computer disables remote control function after receiving an acknowledgement corresponding to the control command from the prober, and the acknowledgement indicates the control command is permitted.

14. The system of claim 13 wherein the server computer enables remote control function after receiving the probe completion message indicating CP test operation corresponding to the control command is complete, and returns the probe completion message to the client computer.

15. The system of claim 9 wherein the control request message is received via Internet.

16. The system of claim 9 wherein the prober raises the probe pin off the specific area of the wafer after CP testing is complete.

17. The system of claim 9 wherein the server computer is coupled to the prober via RS232 or GBIP link.

18. The system of claim 17 wherein the control request message is received through a firewall preventing unauthorized Internet users access to the server computer.

* * * * *